United States Patent
Friesinger et al.

(10) Patent No.: US 12,188,968 B2
(45) Date of Patent: Jan. 7, 2025

(54) CALIBRATION SYSTEM AND CALIBRATION METHOD FOR A VECTOR NETWORK ANALYZER WITH A REMOTE VECTOR ANALYZER FRONTEND

(71) Applicant: Rohde & Schwarz GmbH & Co. KG, Munich (DE)

(72) Inventors: Maximilian Friesinger, Munich (DE); Jakob Hammer, Adelshofen (DE); Michael Zedler, Augsburg (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 0 days.

(21) Appl. No.: 17/863,995

(22) Filed: Jul. 13, 2022

(65) Prior Publication Data
US 2024/0019471 A1 Jan. 18, 2024

(51) Int. Cl.
*G01R 27/28* (2006.01)
*G01R 31/28* (2006.01)
*G01R 35/00* (2006.01)

(52) U.S. Cl.
CPC ......... *G01R 27/28* (2013.01); *G01R 31/2822* (2013.01); *G01R 35/005* (2013.01)

(58) Field of Classification Search
CPC ... G01R 27/28; G01R 31/2822; G01R 35/005
See application file for complete search history.

(56) References Cited

U.S. PATENT DOCUMENTS

| | | | |
|---|---|---|---|
| 5,537,046 A * | 7/1996 | Adamian | G01R 35/005 333/17.1 |
| 7,113,891 B2 | 9/2006 | Anderson | |
| 8,000,656 B1 * | 8/2011 | Jiao | H04B 17/0085 455/67.14 |
| 2004/0006477 A1 | 1/2004 | Craner | |
| 2009/0184721 A1 * | 7/2009 | Albert-Lebrun | G01R 27/32 324/601 |

(Continued)

FOREIGN PATENT DOCUMENTS

WO 2007/021434 A2 2/2007

*Primary Examiner* — Akm Zakaria
(74) *Attorney, Agent, or Firm* — DITTHAVONG, STEINER & MLOTKOWSKI (57) ABSTRACT

The present disclosure relates to a measurement system comprising a vector analyzer (VNA), at least one remote frontend, and a cable connection connecting the at least one frontend to the VNA. The VNA comprises at least one signal source generating a RF signal and providing the RF signal via the cable connection to the at least one remote frontend. The remote frontend includes at least one measurement port for connecting a device under test (DUT) and transmitting the RF signal to the DUT, and at least one directive element. The at least one directive element couples out a transmitted portion of the RF signal and a reflected portion of the RF signal received at the at least one measurement port for measuring the transmitted portion and the reflected portion of the RF signal. The remote frontend further includes at least one dedicated calibration circuit connected between the at least one directive element and the at least one measurement port. The at least one dedicated calibration circuit provides calibration standards for calibrating the measurement system.

13 Claims, 5 Drawing Sheets

(56) References Cited

U.S. PATENT DOCUMENTS

| | | | | |
|---|---|---|---|---|
| 2009/0322347 | A1* | 12/2009 | Hashimshony | G01R 35/007 |
| | | | | 324/601 |
| 2012/0326737 | A1* | 12/2012 | Wen | G01R 35/005 |
| | | | | 324/750.01 |
| 2014/0327429 | A1* | 11/2014 | Ziomek | G01R 27/28 |
| | | | | 324/96 |
| 2020/0220256 | A1* | 7/2020 | Cetinoneri | H01Q 1/2283 |
| 2021/0067257 | A1* | 3/2021 | Lin | H04B 17/16 |
| 2023/0127955 | A1* | 4/2023 | Morrar | H04B 17/14 |
| | | | | 455/12.1 |

\* cited by examiner

CALIBRATION SYSTEM AND CALIBRATION METHOD FOR A VECTOR NETWORK ANALYZER WITH A REMOTE VECTOR ANALYZER FRONTEND

TECHNICAL FIELD

The disclosure relates to the general field of measuring devices and specifically relates to calibrating network analyzers. More specifically, the disclosure relates a calibration system, and a calibration method for a vector network analyzer (VNAs) with a remote vector analyzer frontend.

BACKGROUND ART

A VNA is measuring device for determining a performance of an electrical network by measuring the network parameters of the electrical network as a device under test (DUT). The VNA may be used to measure reflection and transmission properties of the DUT at high signal frequencies to characterize the DUT by its scattering parameters (S-Parameters). The VNA measures both amplitude and phase properties at frequency ranges from approximately 5 kHz up to the range of 110 GHz. By using converter modules for the VNA, the frequency range may be extended to the terahertz (THz) frequency range.

Measurements with a VNA may be adversely affected by different types of errors during the measurement process resulting in inaccuracies in the amplitude and phase of the measurement signal. An example for errors are systematic errors caused by non-ideal components in a measurement setup including the VNA connected to the DUT include insertion losses, impedance mismatch, time delay and a respective phase shift. The systematic errors may change with temperature. The non-ideal components may include cables, adapters and test fixtures, but also internal cables and couplers of the VNA. However, usual requirements to the VNA include high accuracy and repeatability of the measurements.

The VNA may achieve high accuracy of the measurements by correcting the systematic errors internally. The process of error correction regularly includes determining correction parameters based on measurements of known calibration standards in a calibration process and recording the correction parameters. The recorded correction parameters enable the VNA to compensate the actual measurements of the DUT acquired in a measuring process for the systematic errors. The user may perform calibration at regular intervals and at specific environmental conditions, e.g. specific temperatures, and even between individual measurements.

Having determined correction parameters during the calibration process, the VNA may measure a frequency response of the DUT and correcting the measured frequency response for systematic errors providing a highly accurate corrected frequency response.

The known calibration standards used during the calibration process instead of the DUT may include a set of calibrations standards that are connected manually by a test engineer to a measurement port of the VNA (manual calibration units), or automated calibration units that connect the calibration standards automatically to the at least one measurement port of the VNA. Using either the manual calibration standards or using the automated calibration unit may require disconnecting the DUT before a calibration or re-calibration process of the VNA, and connecting the DUT after a calibration or re-calibration process.

In case of a measurement setup including a DUT with a plurality of ports, and, for example, a VNA with a plurality of ports connecting and disconnecting the DUT for calibration may consume a lot of time and may also result in additional errors, e, g, by applying different amount of torque during connecting and disconnecting union nuts of connectors, for example, or inserting dirt into an electrical connection. Thus, additional cost due to increased measurement time involving highly qualified test engineers and additional measurement errors may occur.

SUMMARY

Addressing the issues, there is a need to provide an improved calibration system and an improved calibration method for a VNA, which avoid the noted disadvantages. In particular, there is a need to perform a VNA calibration routine that at least reduces the need to change connections between the devices of the measurement setup and the DUT for calibration.

These and other objectives are achieved by the embodiments provided in the independent claims. The dependent claims include additional features that define advantageous implementations of the present disclosure.

According to a first aspect of the disclosure, a measurement system comprises a vector analyzer (VNA) and at least one remote frontend connected to the VNA via a cable connection, hereinafter realized by a plurality of cables. The VNA comprises at least one signal source configured to generate a RF signal and to provide the RF signal via the cable connection to the remote frontend. The remote frontend includes at least one measurement port for connecting a device under test (DUT) and transmitting the RF signal to the DUT, and at least one directive element. The at least one directive element couples out a transmitted portion of the RF signal (also denoted measurement signal hereinafter) and a reflected portion of the RF signal received at the at least one measurement port for measuring the transmitted portion and the reflected portion of the RF signal. The remote frontend further includes at least one dedicated calibration circuit connected between the at least one directive element and the at least one measurement port. The at least one dedicated calibration circuit provides calibration standards for calibrating the measurement system.

The measurement system realizes a remote frontend of VNA with a dedicated inline calibration device in the remote frontend. The remote frontend may also be called remote head of the VNA.

The term dedicated in the expression dedicated calibration circuit defines that the dedicated calibration circuit is an inseparable and integrated part of the specific remote frontend (remote VNA frontend).

The remote front end is connected to the VNA via a cable connection (the cable connection usually comprising a plurality of cables), which is a potential source for phase drift and additional attenuation of the signals transmitted via the cable connection. The phase drift and the attenuation may change with time and/or with temperature as an example for other environmental conditions.

The first directive element is arranged between the at least one signal source and the first port. The cable connection may connect the signal source generating the RF Signal (measurement signal).

The first directive element is arranged between the signal source and the first port. The cable connection may connect the signal source generating the measurement signal to the remote frontend.

The cable connection in particular a second cable of the plurality of cables forming the cable connection, may connect a local oscillator signal (LO signal) to the remote frontend. Problems leading to error during measurement may in particular occur due to LO phase drift on a second cable.

A third cable may connect a reference signal (wave signal a) at an intermediate frequency (IF) to the remote frontend.

A fourth cable may connect a measurement signal (wave signal b) at IF from the remote frontend to the VNA.

Additional cables for power supply of the remote frontend, for controlling the remote frontend and, in particular, for controlling the dedicated calibration circuit connecting the VNA and the at least one remote frontend might be present in the measurement system.

The calibration system is advantageous, as once having set up a measurement configuration (measurement setup) using the measurement system and the DUT, the measurement system dispenses with connecting or disconnecting the DUT for performing calibration or recalibration of the VNA and the at least one remote frontend. The measurement system may be calibrated or recalibrated at any given time and regularly by a user simply operating a respective operating element or even by generating automatically a respective control signal in the measurement system.

A signal path between the VNA and the dedicated calibration circuit is calibrated in a particularly advantageous manner due to dispensing with the cumbersome and time-consuming connecting of external calibration standards. The signal path between the VNA and the dedicated calibration circuit represents a significant portion of the signal path between the VNA and the DUT. Using externally connected calibration standards is required for calibrating the portion of the signal path from the dedicated calibration circuit to the DUT. This smaller portion of the entire signal path between the VNA and the DUT has a less significant influence on the measurement than the portion of the signal path between the VNA and the dedicated calibration circuit. Thus, a time interval between (re-) calibrations using externally connected calibration standards may be increased for the calibration system without adversely affecting measurement accuracy.

The calibration time and therefore the overall measurement time significantly decreases significantly without impairing the accuracy of the measurement. Hence, the measurement system with the calibration system yields the capability to significantly decrease running cost without adversely affecting quality of the measurement results.

The cited advantages even increase with the number of ports of the DUT to be measured, and, therefore apply in particular to measurement systems including a plurality of remote frontends. Depending on the number of ports of the DUT, a disconnecting process and a reconnecting process consumes significant time and even represent a source for faults. The more DUT ports, the higher the effort and the probability of faults will be. The advantageous effects of the calibration system therefore scale with the number of ports of the DUT to be measured simultaneously.

Decreasing the calibration time and reducing the user effort results in reducing overall cost for the customer using the calibration system.

The at least one dedicated calibration circuit may be configured to provide the calibration standards including an open load calibration standard (OPEN), a short load calibration standard (SHORT) and a matched load calibration standard (MATCH).

The remote frontend may arrange the at least one dedicated calibration circuit on a same substrate of the remote frontend on which a transmission line transmitting the RF signal to the at least one measurement port is arranged.

Thus, advantageous manufacturing characteristics due to an integrated design with a low number of components and the capability to design a compact remote frontend are achieved. The at least one dedicated calibration circuit may be formed using discrete electric components arranged on the substrate.

The measurement system may further comprise a control circuit configured to control the at least one dedicated calibration circuit in at least a first calibration mode.

Operated in the first calibration mode, the control circuit consecutively (sequentially) selects a respective calibration standard from the calibration standards provided by the at least one dedicated calibration circuit.

Thus, the control circuit controlling the calibration, e. g. including applying the respective calibration standards SHORT, OPEN, MATCH in an OSM-calibration routine, forms an integral part of the calibration system.

According to an embodiment, the control circuit is configured to switch the at least one dedicated calibration circuit into the first calibration mode to control the at least one dedicated calibration circuit in the first calibration mode after at least one of a predetermined time interval has elapsed and a predetermined number of measurement cycles is reached.

Therefore, initiating a recalibration of the measurement setup may be controlled in an automated manner, benefiting further from the remote frontend with the dedicated calibration circuit, which is arranged inline, thereby integrated with the measurement setup.

The measurement system may further comprise an output interface.

The output interface provides an interface to an internal output means, e.g. a display with an HMI, of the measurement system, or to an external output means, e.g. a server or computer used for controlling the measurement system.

The control circuit may generate and output a message via the output interface for prompting the control circuit to switch the at least one dedicated calibration circuit into a second calibration mode to control the at least one dedicated calibration circuit in the second calibration mode. The control circuit may provide a message indicating that performing calibration in the second calibration mode is required via the output means to the user.

Calibrating in the second calibrating mode enables to obtain measurement data of the known external calibration standards, which in turn enable to correct the measurement data obtained in the first calibration mode for the known internal calibration standards. Thus, performing a calibration process in the second calibration mode enables to calibrate the measurements of the internal calibration standards obtained during the calibration process in the first calibration mode.

The dedicated calibration circuit can be recalibrated at longer time intervals than the predetermined time interval between the recalibration in the first calibration mode, in particular after a plurality of predetermined time intervals, has elapsed. Thus, calibration in the second calibration mode may be performed after a plurality of recalibrations in the first calibration mode have occurred. The subject of calibration in the second calibration mode may include measurement cables connecting the measurement port of the remote frontend with corresponding ports of the DUT.

This is advantageous, as only during calibration processing in the second calibration mode, the user has to connect and disconnect cables at the measurement port, for example by loosening and tightening respective union screws of connecting elements (connectors). In particular, for a short transmission line length between the dedicated calibrating circuit and the measurement port of the remote VNA frontend, the dedicated calibrating circuit provides the effect that the more burdensome and time-consuming calibration in the second calibration mode will be less often required for achieving a same, or even a better quality of measurement results, due to a frequent recalibration in the first calibration mode.

The measurement system may, when operating in the second calibration mode, include the control circuit configured to control the dedicated calibration circuit to establish a direct connection between the at least one directive element and the at least one measurement port.

In the second calibration mode, the control circuit may control measuring external calibration standards connected with the at least one measurement port.

Establishing a direct connection corresponds to establishing a through connection between the at least one directive element and the measurement port.

In the second calibration mode, the control circuit may generate and output a message via the output interface for guiding a user to connect the external calibration standards to the at least one measurement port, and to control measuring the external calibration standards connected to the at least one measurement port.

The control circuit may indicate via the interface that the user, e.g. a test engineer, is required to connect a required calibration test standard, e.g. OPEN, SHORT or MATCH of an OSM calibration routine, to the measurement port in the next step of the calibration process in the second calibration mode.

Alternatively or additionally, the control circuit may read an input obtained via the output interface that indicates whether the user connected the required calibration test standard, e.g. OPEN, SHORT or MATCH, to the measurement port. Subsequently, the control circuit proceeds to performing measurement of the connected external calibration standard in case the requested confirmation is input by the user.

The external calibration standard may be connected to a second end of a measurement cable, while a first end of the measurement cable is connected to the measurement port of the remote frontend.

Alternatively, the external calibration standard may be connected directly to the measurement port of the remote frontend, e.g. in case no measurement cable is intended to be used while measuring the DUT.

The measurement system may further comprise at least one measurement cable connected with a first end to the least one measurement port. Operating in the second calibration mode, the control circuit can generate and output a message via the output interface for guiding a user to connect the external calibration standards to a second end of the at least one measurement cable.

The control circuit of an embodiment switches the at least one dedicated calibration circuit into the second calibration mode more often than switching the at least one dedicated calibration circuit into the first calibration mode.

The control circuit can switch the at least one dedicated calibration circuit into the second calibration mode and control the at least one dedicated calibration circuit in the second calibration mode after at least one of a further predetermined time interval has elapsed, a further predetermined number of measurement cycles is reached, and a first measurement cycle is started.

The further predetermined time interval may be longer than the predetermined time interval.

The further predetermined number of measurement cycles may be larger than the predetermined number of measurement cycles.

In the first and the second calibration mode, the control circuit may measure a voltage reflection coefficient for each calibration standard of the calibration standards of the dedicated calibration circuit, and the external calibration standards.

The at least one dedicated calibration circuit comprises a plurality of semiconductor switches, e.g. semiconductor diodes, configured to switch selectively between the respective calibration standards of the calibration standards and to directly connect the at least one directive element with the at least one measurement port.

The measurement system can comprise a second remote frontend, a third remote frontend and a fourth remote frontend in addition to the at least one frontend as a first frontend. Each of the first remote frontend, the second remote frontend, the third remote frontend and the fourth remote frontend respectively comprises at least one respective measurement port for connecting the DUT and transmitting the RF signal to the DUT, and at least one respective directive element. The at least one respective directive element of each of the first remote frontend, the second remote frontend, the third remote frontend and the fourth remote frontend may couple a respective transmitted portion of the (RF signal (measurement signal) out and a respective reflected portion of the measurement signal received at the at least one respective measurement port for measuring the respective transmitted portion and the respective reflected portion of the measurement signal. Each of the first remote frontend, the second remote frontend, the third remote frontend, and the fourth remote frontend respectively further comprises at least one respective calibration circuit connected between the at least one respective directive element and the at least one respective measurement port. The at least one respective dedicated calibration circuit is configured to provide respective calibration standards as internal calibration standards for calibrating the measurement system.

The first remote frontend, the second remote frontend, the third remote frontend, and the fourth remote frontend can each comprise a respective housing for arranging the first remote frontend, the second remote frontend, the third remote frontend, and the fourth remote frontend spaced apart from each other and separate and spaced apart from the VNA.

Thus, the individual remote frontends may be positioned exactly at locations, which are determined by the physical layout of the DUT, e.g. the locations of the ports of the DUT to be measured.

According to an embodiment, the measurement system comprises further a control circuit configured to control the respective dedicated calibration circuits of the first remote frontend, the second remote frontend, the third remote frontend, and the fourth remote frontend in at least a first calibration mode. In the first calibration mode, the control circuit may select sequentially a respective calibration standard from the calibration standards provided by the each respective dedicated calibration circuit of the first remote frontend, the second remote frontend, the third remote frontend, and the fourth remote frontend. The control circuit can control at least two of the respective dedicated calibration circuits of the first remote frontend, the second remote frontend, the third remote frontend, and the fourth remote frontend in the first calibration mode at a same time (simultaneously).

The at least one signal source (first signal source) can be configured to generate the measurement signal and to provide the generated measurement signal via the respective first cable of the plurality of cables to each of the first remote frontend, the second remote frontend, the third remote frontend, and the fourth remote frontend.

Alternatively, the VNA can comprise a plurality of signal sources, which include the first signal source, and further a second signal source, a third signal source and a fourth signal source. Each of the first signal source, the second signal source, the third signal source and the fourth signal source can generate a respective measurement signal (RF signal) and provide the respective measurement signal via a respective first cable of the plurality of cables to the respective remote frontend of the first remote frontend, the second remote frontend, the third remote frontend, and the fourth remote frontend, independent from the respective other signal sources of the first signal source, the second signal source, the third signal source and the fourth signal source.

A second aspect of the disclosure relates to a calibration method for a measurement system. The measurement system comprises a vector network analyzer (VNA), at least one remote frontend connected to the VNA via a cable connection (a plurality of cables). The remote frontend includes at least one dedicated calibration circuit connected between the at least one directive element and the at least one measurement port, and the at least one dedicated calibration circuit is configured to provide calibration standards (internal calibration standards) for calibrating the measurement system. The calibration method comprises connecting, to at least one measurement port of the remote frontend, a device under test (DUT); generating, by at least one signal source of the VNA, a measurement signal and providing the measurement signal via the cable connection and via directive element of the at least one remote frontend to the at least one measurement port; and transmitting the measurement signal to the DUT via the at least one measurement port. The at least one directive element couples out a transmitted portion of the measurement signal and a reflected portion of the measurement signal received at the at least one measurement port for measuring the transmitted portion and the reflected portion of the measurement signal. The method further comprises a step of controlling, by a control circuit of the measurement system, the dedicated calibration circuit in a calibration mode, in which the dedicated calibration circuit provides the calibration standards for calibrating the measurements system.

The description with regard to calibration system according to the first aspect of the disclosure is correspondingly valid for the calibration method according to the second aspect.

BRIEF DESCRIPTION OF THE DRAWINGS

The described aspects and implementations of the disclosure will be explained in the following description of specific embodiments in relation to the enclosed drawings, in which.

DETAILED DESCRIPTION OF EMBODIMENTS

Figure 1:
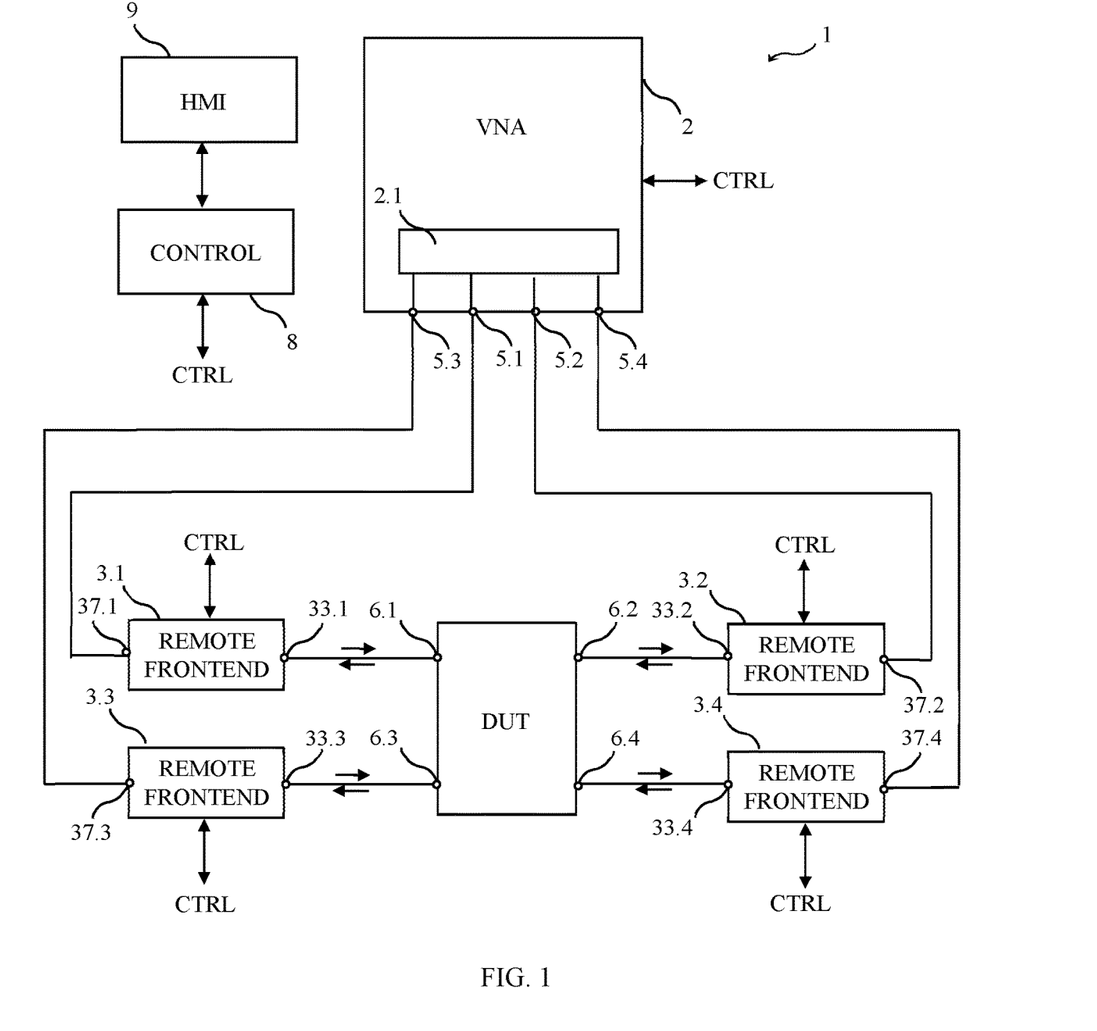
FIG. 1 provides an overview of a measurement setup including a measurement system comprising a VNA, plural remote VNA frontends for the VNA, and a DUT.

FIG. 1 provides a schematic overview of the measurement setup including the measurement system 1 comprising a VNA 2, a first remote VNA frontend 3.1, a second remote VNA frontend 3.2, a third remote VNA frontend 3.3, and a fourth remote VNA frontend 3.4 for the VNA 2 together with a DUT 4.

The term remote VNA frontend 3, and remote frontend 3 is interchangeably used.

The first remote VNA frontend 3.1, the second remote VNA frontend 3.2, the third remote VNA frontend 3.3, and the fourth remote VNA frontend 3.4 may have a corresponding, in particular an identical structure. This may, in particular, also apply to the respective dedicated calibration circuit 3 of the first remote VNA frontend 3.1, the second remote VNA frontend 3.2, the third remote VNA frontend 3.3, and the fourth remote VNA frontend 3.4. The respective dedicated calibration circuits 3 of different remote VNA frontends 3 may have a same structure, e.g. be identical to each other.

The VNA 2 may be a multi-port network analyzer. The depicted VNA 2 includes four VNA ports, including a first VNA port 5.1, a second VNA port 5.2, a third VNA port 5.3 and a fourth VNA port 5.4.

The VNA 2 may comprise at least one signal source 2.1 (first signal source) configured to generate a measurement signal, e.g. a radio frequency (RF) signal and provide the generated measurement signal via respective cables of the cable connection to each of the first remote VNA frontend 3.1, the second remote VNA frontend 3.2, the third remote VNA frontend 3.3, and the fourth remote VNA frontend 3.4.

FIG. 1 illustrates the measurement signal path via the respective cables. In the cable connection, there exist further cables in parallel to the cables connecting the VNA 2 and each of the first remote VNA frontend 3.1, the second remote VNA frontend 3.2, the third remote VNA frontend 3.3, and the fourth remote VNA frontend 3.4, for example for transmitting local oscillator signals, and for transmitting measured parameters.

Alternatively, the VNA 2 can comprise a plurality of signal sources 2.1, which include the first signal source 2.1, and, as further signal sources, a second signal source, a third signal source and a fourth signal source, for example. Each of the first signal source 2.1, the second signal source, the third signal source and the fourth signal source can generate a respective measurement signal and provide the respective measurement signal via respective cables to the respective remote VNA frontend 3.$i$ including the first remote VNA frontend 3.1, the second remote VNA frontend 3.2, the third remote VNA frontend 3.3, and the fourth remote VNA frontend 3.4, independent from the respective other signal sources including the first signal source 2.1, the second signal source, the third signal source and the fourth signal source.

The VNA 2 can be calibrated based on calibration data that is recorded during the different calibration measurements with the various calibration standards.

The DUT 4 can be any type of a radio frequency (RF) device, in particular a filtering device, e.g. a filter bank including a plurality of elementary RF filters, or a wafer including a plurality of RF devices for transmitting RF signals arranged on the wafer.

The specific DUT 4 shown in FIG. 1 includes four ports 6.*i* respectively configured to transmit and/or to receive RF signals via the port 6.*i*. The specific example for the DUT 4 includes a first port 6.1, a second port 6.2, a third port 6.3 and a fourth port 6.4.

The measurement system 1 comprises four remote VNA frontends 3. Each of the remote VNA frontends 3 is associated with exactly one VNA port 5.*i* of the plurality of VNA ports including the first VNA port 5.1, the second VNA port 5.2, the third VNA port 5.3 and the fourth VNA port 5.4 of the VNA 2.

Each of the remote VNA frontends 3.*i* is also associated with exactly one port 6.*i* of the plurality of ports of the DUT 4 including the first port 6.1, the second port 6.2, the third port 6.3 and the fourth port 6.4.

For example, the first measurement port 33.1 of the first remote VNA frontend 3.1 is connected via a measurement cable with the first port 6.1 of the DUT 4. A first port 37.1 of the first remote VNA frontend 3.1 is connected with the first VNA port 5.1 of the VNA 2 via the respective cable of the cable connection.

Thus, the VNA 2 may generate a measurement signal, and provide the measurement signal via the first VNA port 5.1 and the respective cable of the cable connection to the first port 37.1 of the first remote VNA frontend 3.1, and the first remote VNA frontend 3.1 may provide the received measurement signal via the measurement port 33.1 and the measurement cable to the first port 6.1 of the DUT 4.

The DUT 4 may, for example due to an internal transmission line mismatch, reflects a portion of the incident measurement signal at the first port 6.1 of the DUT 4. The reflected portion of the measurement signal is transmitted via the measurement cable to the measurement port 33.1 of the remote VNA frontend 3.1, and from the first port 37.1 of the of the remote VNA frontend 33.1 via the respective cable of the cable connection to the first VNA port 5.1 of the VNA 2.

The measurement system 1 arranges the remote VNA frontends 3.*i* characteristically close to the DUT 4. Thus, for example a length of the measurement cable connecting the measurement port 33.1 of the remote VNA frontend 3.1 and the port 6.1 of the DUT 4 is short. In particular, the length of the measurement cable connecting the measurement port 33.1 of the remote VNA frontend 3.1 and the port 6.1 of the DUT 4 is significantly shorter than the length of the cable in the cable connection connecting the first VNA port 5.1 of the VNA 2 and the first port 37.1 of the remote VNA frontend 3.1.

The electrical characteristics of the cables in the cable connection may therefore significantly influence any measurement due to the respective insertion loss or phase shift resulting from the respective cable.

Reducing the effect of systematic measurement errors requires therefore calibration, and also frequent recalibration in case of changing environmental conditions, of the measurement setup.

Cost of electrical cables with advantageous transmission properties, e.g. low insertion loss and phase shift, over wide frequency bands are significant, in particular in the field of high frequency electronics.

Connecting and disconnecting electrical cables, in particular in the field of high frequency electronics, may require high precision by the personnel, low levels of dust, and even use of precision torque wrenches in order to achieve an advantageous and reproducible quality of transmission and reflection properties for RF signals at the respective connections.

The discussed aspects concerning the respective cables in the cable connection and measurement cables between the VNA 2, the remote VNA frontend 3.1, and the DUT 4 apply correspondingly to the further remote VNA frontends 3.2, 3.3, 3.4.

A corresponding signal path as discussed for the measurement signal from the first VNA port 5.1 of the NVA 2 to the first port 6.1 of the DUT 4 via the first remote NVA frontend 3.1 applies for the signal path from the second VNA port 5.2 of the NVA 2 to the second port 6.2 of the DUT 4 via the second remote VNA frontend 3.2.

A corresponding signal path as discussed for the measurement signal from the first VNA port 5.1 of the NVA 2 to the first port 6.1 of the DUT 4 via the first remote NVA frontend 3.1 applies for the signal path from the third VNA port 5.3 of the NVA 2 to the third port 6.3 of the DUT 4 via the third remote VNA frontend 3.3.

A corresponding signal path as discussed for the measurement signal from the first VNA port 5.1 of the NVA 2 to the first port 6.1 of the DUT 4 via the first remote NVA frontend 3.1 applies for the signal path from the fourth VNA port 5.4 of the NVA 2 to the fourth port 6.4 of the DUT 4 via the fourth remote VNA frontend 3.4.

A control circuit 8 of the measurement system 1 may also be configured to control the calibration system. The control circuit 8 may form part of the VNA 2 or be a separate device. The control circuit 8 may include a processor, a memory for storing program data and/or application data.

The stored data may include at least one set of correction coefficients for correcting measured parameter values, the correction coefficients obtained by performing calibration of the measurement setup.

The control circuit 8 may generate control signals for controlling a measurement routine (measurement process), for controlling a calibration routine (calibration process), and/or for switching the measurement system between different operational modes, including, e.g., different measurement modes, the first calibration mode and the second calibration mode.

Operational modes may include at least one measurement mode, in which the VNA 2 measures parameters of the DUT 4 by generating measurement signals, provides the measurement signals to the DUT 4 via at least one of the first remote VNA frontend 3.1, the second remote VNA frontend 3.2, the third remote VNA frontend 3.3, and the fourth remote VNA frontend 3.4.

Operational modes may include at least one calibration mode. The calibration mode may include at least one first calibration mode in which a dedicated calibration circuit 32 of each remote VNA frontend 3.*i* performs calibration using internally generated calibration standards.

The calibration mode may include at least one second calibration mode in which at least one set of external calibration standards is selectively applied to the measurement port 33 and a calibration process is performed to determine calibration coefficients for a calibration of the measurement setup. The control circuit 8 can be configured to guide a user through the calibration process according to the second calibration mode.

Guiding the user through the calibration process in the second calibration mode may include outputting a message to the user, which external calibration standard of a predetermined set of external calibration standards to connect to which measurement port 33. Guiding the user through the calibration process may include receiving a user input.

A human machine interface HMI 9 may form part of the measurement system 1. The HMI 9 may be implemented based on visual and/or acoustic output means, e.g. a display, a loudspeaker, and respective input means, e.g. a mouse, a trackball, a trackpad, a keyboard and/or a microphone. The HMI 9 may include software running on a processor, which interprets the user input and provides the interpreted user input to the control circuit 8.

The control circuit 8 may perform control of the measurement system 1 based on the interpreted user input.

The VNA 2 can be calibrated based on calibration data that is recorded during the different calibration measurements with the various calibration standards.

The DUT 4 may be arranged in a climate cell to simulate exposure of the DUT 4 to various environmental conditions. Environmental conditions may include at least one of various humidity levels, air pressure levels and temperature levels. The climate cell may be configured to vary one or more of the environmental conditions according to a climate profile, in particular according to a temperature profile. In this application scenario, the remote VNA frontend 3 is also arranged within the climate cell.

Alternatively, the remote VNA frontends 3 are arranged outside the climate cell.

With the measurement system 1 of FIG. 1 including the calibration system, parameters including a directivity, a reflection tracking, a source match, a transmission tracking and a load match may be measured during while exposing the DUT 4 to a temperature cycle without having to change connections between the remote VNA frontend 3 with the internally dedicated calibration circuit 32 and the DUT 4 for calibrating the measurement setup. Thus, the user is able to perform systematic error correction during measurement, e.g. an E-term correction on a two-port and/or a UOSM calibration routine, over a wide specified temperature range while miming the measurement routine simultaneously with a slow and long lasting temperature profile, for example. No additional connection steps have to be made once the measurement configuration of FIG. 1 is set up, a first calibration in the second calibration mode and the first calibration mode each has been performed. While running the temperature profile, the calibration system may regularly switch into the first calibration mode in order to compute new correction coefficients during a recalibration. This proves particularly advantageous in scenarios, in which the DUT 4 is arranged within a climate cell.

Figure 2:
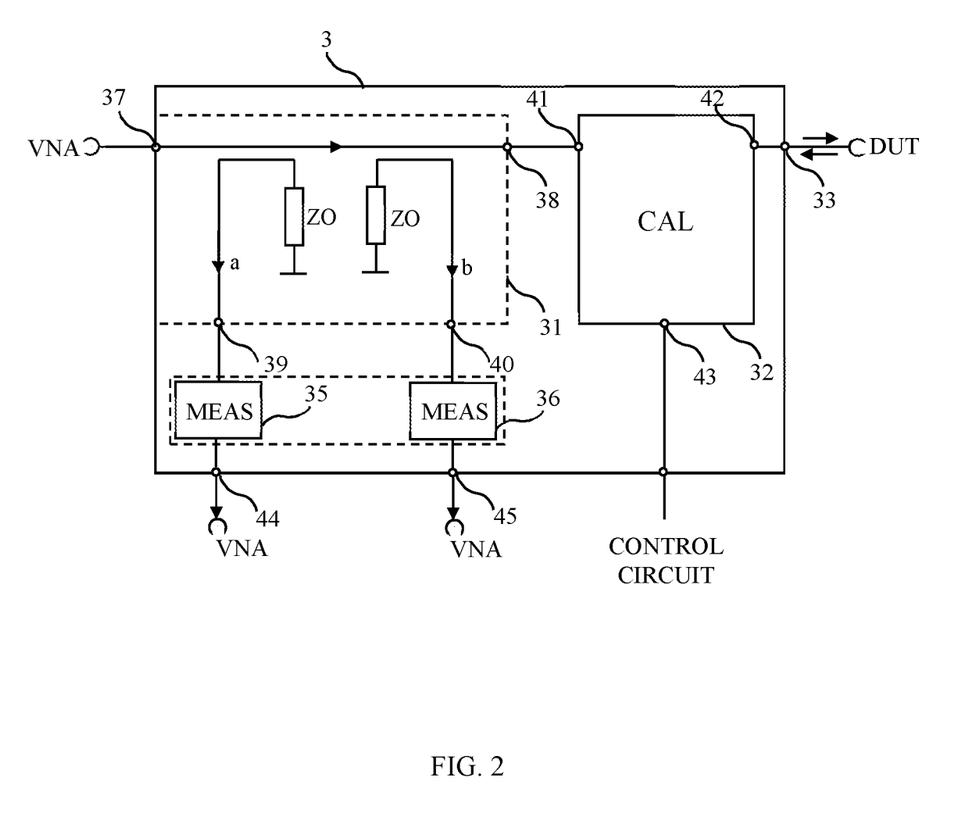
FIG. 2 shows a schematic diagram of a remote VNA frontend for the VNA according to an embodiment.

FIG. 2 shows a schematic diagram of the remote VNA frontend 3 for the VNA 2 according to an embodiment.

The remote VNA frontend 3 comprises a directive element 31 and a dedicated calibration circuit 32.

The remote VNA frontend 3 may be designed as one single device arranged within one housing, wherein the dedicated calibration circuit 32 and the directive element 31 are arranged in the housing. The various ports of the dedicated calibration circuit 32 and the directive element 31 can be arranged as externally accessible ports at the housing. In a specific example, the dedicated calibration unit 32 may comprise a communication interface 43 for exchanging communication data, e.g. with the VNA 2 or another device, e.g. a control device including the control circuit 8.

The remote frontend 3 includes a first port 37, which is connected to the VNA port 5.i of the VNA 2. The VNA 2 provides the measurement signal via a first cable of the cable connection to the first port 37 of the remote VNA frontend 3. The first port 37 corresponds to a first port 37 of the directive element 31. The directive element 31 provides the measurement signal via transmission line as an incident wave to the second port 38 of the directive element 31.

The transmission line may further receive a reflected portion of the measurement signal transmitted via the second port 38 of the directive element as a reflected wave and transmit the reflected wave towards the first port 37 of the directive element 31. The reflected portion of the measurement signal may result from an impedance mismatch at the port 6 of the DUT 4.

The directive element 31 is configured to couple a portion of the measurement signal out and provide the portion as incident wave at the third port 39.

The directive element 31 is configured to couple a portion of the reflected portion of the measurement signal out and provide the portion as the reflected wave b at the fourth port 40.

The remote frontend may comprise measurement units 35, 36 to respectively measure the incident wave a, and the reflected wave b. The measurement units 35, 36 may form part of the directional element 31, of the remote VNA frontend 3, or the VNA 2. The measurement units 35, 36 may be included in one measurement and evaluation unit as indicated by the hatched line in FIG. 2.

The measurement and evaluation unit may be configured to compute scattering parameters (S-parameters) based on measured values for the incident wave a and the reflected wave b provided by the directive element 31.

Alternatively, the measurement and evaluation unit may form part of the VNA 2 and may include signal processing capabilities and memory capacity in an internal or external memory for recording data. The data may include application data including measurement data, calibration data, program data including program data for at least on calibration routine, calibration data for at least one internal set of calibration standards, calibration data for one or more external sets of calibration standards, and/or correction parameters for correcting raw measurement data.

The remote VNA frontend 3 may comprise a plurality of further ports connected via cables with the VNA 2 in addition to the first cable connected to the first port VNA of the remote VNA frontend 3. FIG. 2 exemplarily indicates measurement ports 44 and 45 for providing measurement data including measured values for the incident wave a, and the reflected wave b respectively at the measurement ports 44, 45.

Additionally, the remote VNA frontend 3 may comprise ports including a port for connecting a local oscillator signal LO to the remote VNA frontend 3. A phase shift and an insertion loss of a LO signal cabling may in particular adversely affect accuracy of a measurement at the measurement port 33.

The remote VNA frontend 3 may comprise ports including at least one port for connecting at least one intermediate frequency signal (IF) signal or baseband signal to the remote VNA frontend 3.

The remote VNA frontend 3 may also include ports including at least one port providing power supply for the components of the remote VNA frontend 3.

The directive element 31 depicted in FIG. 2 can be implemented using a backward-coupler architecture widely used and as indicated in FIG. 2.

Alternatively or additionally, the directive element 31 may be implemented based on an architecture including a high-frequency directive element and a low high-frequency directive element.

The low-frequency directive element 31 may be implemented using a circuit topology including a resistive bridge.

The high-frequency directive element 31 may be implemented using a circuit topology including a backward-coupler or a forward-coupler for measuring the incident wave signal a transmitted via the measurement port to the DUT 4 and the reflected wave signal b received via the measurement port 33 from the DUT 4.

The directive element 31 may be implemented using a circuit topology that includes a resistive tap for measuring the incident wave signal a.

The second port 38 of the directive element 31 is connected to a first port 41 of the dedicated calibration circuit 32.

The dedicated calibration circuit 32 may include calibration standards for performing an OSM-calibration, including a calibration standard OPEN, a calibration standard SHORT and a calibration standard MATCH. The dedicated calibration circuit 32 may be configured to selectively provide the OPEN, SHORT and MATCH calibration standards to the VNA 2, e.g. to generate the calibration standards and to connect them to the second port 38 of the directive element 31 via the first port 41 of the dedicated calibration circuit 32. For instance, for providing the SHORT calibration standard, the dedicated calibration circuit 32 is configured to short-circuit the first port 41 to ground. In order to provide the OPEN calibration standard, the dedicated calibration circuit 32 is configured to leave its first port 41 open. For providing the MATCH calibration standard, the dedicated calibration circuit 32 is configured to switch a matched load to the first port 41 of the dedicated calibration circuit 32.

The matched load may be a load of 50Ω for a line impedance of 50Ω for the transmission line connecting the second port 38 of the directive element 31 and the first port 41 of the dedicated calibration circuit 32. Other impedance values, e.g. 75Ω, for the matched load are equally possible, as long as the line impedance of the transmission line for the measurement signal is met.

The dedicated calibration circuit 32 further includes a through connection between the directive element 31 and the measurement port 33. The trough connection corresponds to a transmission line matched to the line impedances at the first port 41 of the dedicated calibration circuit 32 and at the second port 42 of the dedicated calibration circuit 32.

The dedicated calibration circuit 32 may comprise switching element for selectively switching between the OPEN, SHORT and MATCH calibration standards, and the through connection. The respective switching elements may include, e.g. single pole three-way throw- (SP3T-) switches. The switching elements can be controlled to establish or break connections to generate the calibration standards as internal calibration standards of the dedicated calibration circuit 32, to connect the internal calibration standards to the first port 41 of the dedicated calibration circuit 32, depending on which calibration measurement, or alternatively to connect a through connection in case a measurement of an external calibration standard or of the DUT 4 is to be performed.

The dedicated calibration unit 32 may operate as an automatic calibration unit, which is configured to automatically switch between the different calibration standards included in the dedicated calibration unit 32 during performance of a calibration routine of the VNA.

The dedicated calibration unit 32 may perform switching between the different calibration standards available in the dedicated calibration circuit 32 based on a control signal provided by a control circuit. The dedicated calibration unit 32 can comprise a processing unit for controlling the individual elements of the dedicated calibration circuit 32, in particular the switching elements while executing a calibration routine, e.g. based control commands stored in a memory of the dedicated calibration unit 32 or via the communication interface 43 from the control circuit 8, received from the VNA 2 or an external control device.

The control circuit 8 may be part of the remote frontend 3. Alternatively the control circuit 8 may form part of a different device of the measurement system 1, e.g. the VNA 2.

Alternatively, the control circuit 8 is part of or corresponds to a dedicated control device, e.g. a computer configured for controlling the measurement system 1.

The second port 42 of the dedicated calibration circuit 32 is connected with the measurement port 33 of the remote VNA frontend 3. The measurement port 33 may connect directly to the DUT 4. Alternatively, the measurement port 33 will connect via a measurement cable to the DUT 4.

Alternatively, in particular while executing the calibration process 61 in the second calibration mode, the measurement port 33 is connected with a selected external calibration standard of an external set of calibration standards.

The external calibration standard may be connected to a second end of the measurement cable. The first end of the measurement cable is connected with the measurement port 33. A reference plane for the calibration process will be at the second end of the measurement cable. The correction coefficients computed by the calibration process 61 will enable a correction of measurements of the DUT 4 connected to the second end of the measurement cable as the reference plane.

Alternatively, the external calibration standard may be connected directly, e.g. without a measurement cable, with the measurement port 33. In this case, a reference plane for the calibration process will be at the measurement port 33. The correction coefficients computed by the calibration process 61 will enable a correction of measurements of the DUT 4 connected directly, e.g. without a measurement cable, with the measurement port 33 as the reference plane.

The measurement port 33 corresponds to the reference plane for the calibration process 62 using the dedicated calibration circuit 32.

Figure 3:
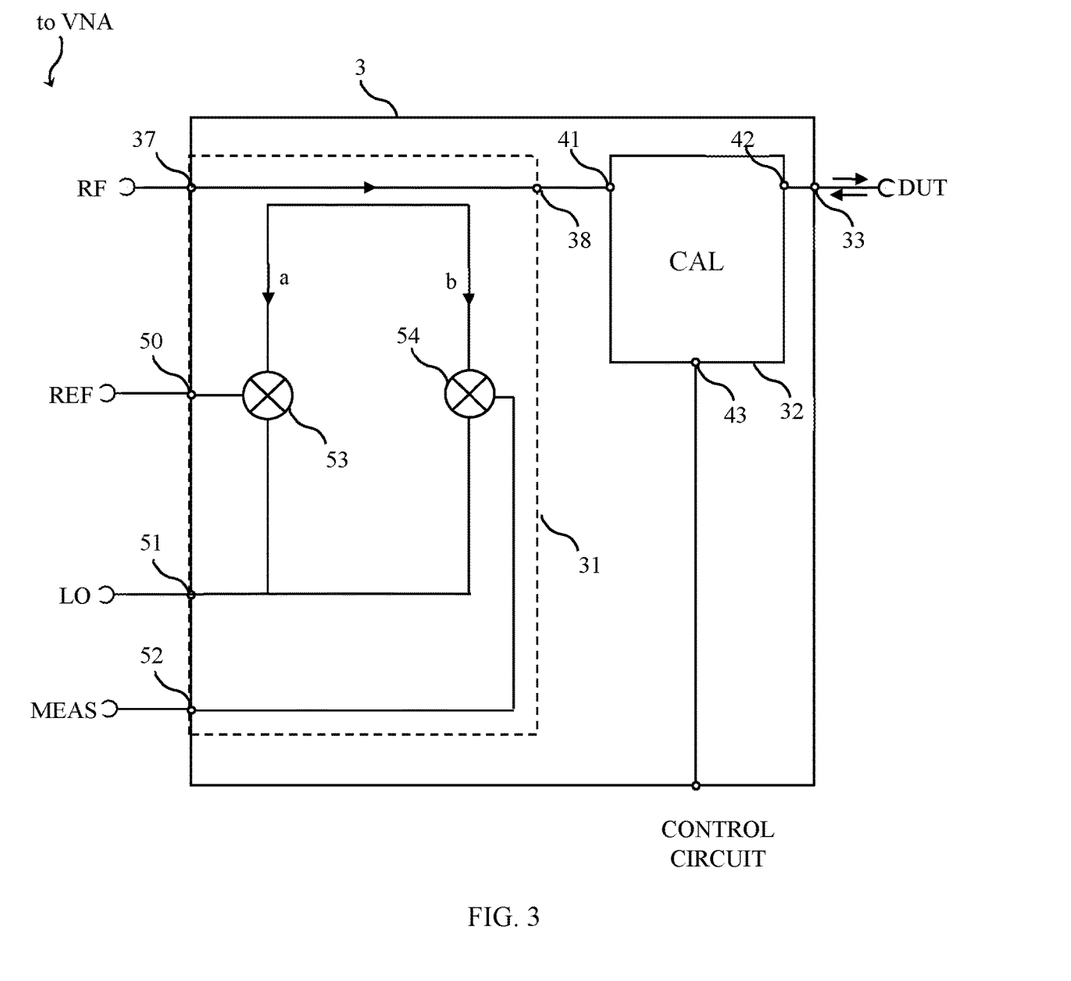
FIG. 3 shows a further schematic diagram of a remote VNA frontend for the VNA according to an embodiment.

FIG. 3 shows a further schematic diagram of a remote VNA frontend 3 for the VNA 2.

The schematic diagram of FIG. 3 corresponds in many aspects to the remote VNA frontend 3, in particular with regard to the dedicated calibration circuit 32 and the transmission line of the measurement signal between the first port 37 of the remote VNA frontend 3 via the directive element 31, further via the dedicated calibration circuit 32 to the measurement port 33.

In FIG. 3, a specific embodiment of the directive element 31 is shown. The directive element 31 includes frequency mixers 53, 54 for respectively converting the incident wave signal and the reflected wave signal b with a local oscillator signal LO into the baseband.

The VNA 2 may provide the local oscillator signal LO via a cable to the port LO 51 of the remote VNA frontend 3. A phase shift, in particular a time-variant phase shift, on the cable transmitting the local oscillator signal LO from the VNA 2 to the port LO 51, or an insertion loss, in particular a time-variant insertion loss, on the cable transmitting the local oscillator signal LO from the VNA 2 to the port LO 51 may therefore decrease accuracy of the measurement of the DUT 4.

The directive element 31 provides a reference signal REF, in particular a reference voltage signal generated based on the incident wave signal a and the local oscillator signal LO via the port 50 of the remote VNA frontend 3, and further via a cable to the VNA 2.

The directive element 31 provides a measurement signal MEAS, in particular a measurement voltage signal generated based on the reflected wave signal b and the local oscillator signal LO via the port 52 of the remote VNA frontend 3, and further via a cable to the VNA 2.

A voltage reflection coefficient may be determined based on a measurement using the specific design of the directive element 31. In particular, during calibration processing in the first calibration mode, the directive element 31 may determine the voltage reflection coefficient based on the measurement performed by the directive element 31 for each individual calibration standard of the set of calibration standards provided by the dedicated calibration circuit 32 in the first calibration mode.

Furthermore, during calibration processing in the second calibration mode, the directive element 31 may determine the voltage reflection coefficient based on the measurement performed by the directive element 31 for each individual calibration standard of the set of external calibration standards connected to the measurement port 33 in the second calibration mode.

Figure 4:
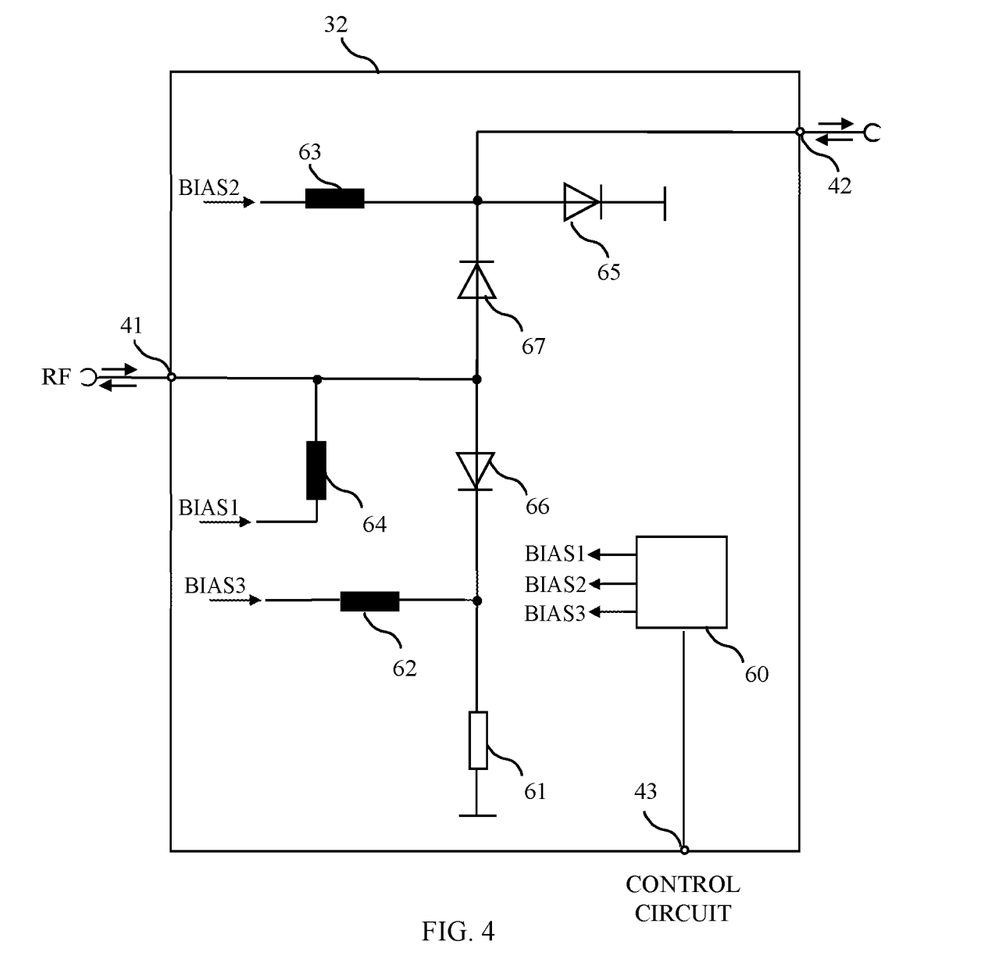
FIG. 4 shows a schematic diagram of a dedicated calibration circuit of a remote VNA frontend according to an embodiment.

FIG. 4 provides a schematic diagram of a dedicated calibration circuit 31 of a remote VNA frontend 3.

The dedicated calibration circuit 32 may comprise a plurality of diodes including diodes 65, 66, 67 for switching either a through connection between the first port 41 of the dedicated calibration circuit 31 and the second port 42 of the dedicated calibration circuit 31, or alternatively one selected calibration standard of a set of calibration standards implemented integrally within the dedicated calibration circuit 31. Selecting the through connection or the one selected calibration standard is performed by biasing the diodes 65, 66, 67 by applying a specific combination of bias voltages BIAS1, BIAS2, BIAS3 in the specific example of FIG. 4.

The through connection corresponds to an electrically conducting connection between the first port 41 of the dedicated calibration circuit 32 and the second port 42 of dedicated calibration circuit 32 with the respective transmission line impedance matching impedances at the first port 41 and the second port 42.

The depicted dedicated calibration circuit 32 implements a set of calibrations standards that includes a SHORT calibration standard, an OPEN calibration standard, and a MATCH calibration standard.

The depicted dedicated calibration circuit 32 provides the selected calibration standard with the first port 41 as a reference plane. Thus, a transmission line length of the transmission line between the first port 41 of the dedicated calibration circuit 32 via the second port 42 of the dedicated calibration circuit 32 to the measurement port 33 should be selected accordingly, in particular be as short as possible, as the transmission line between the first port 41 of the dedicated calibration circuit 32 via the second port 42 of the dedicated calibration circuit 32 is not calibrated by calibration processing in the first calibration mode using the internal calibration standards of the dedicated calibration circuit 32.

The MATCH calibration standard of the specific example of FIG. 4 is implemented by switching the impedance 61 as a load to the first port 41.

A switching control circuit 60 of the dedicated calibration circuit 31 may generate the respective combination of bias voltages BIAS1, BIAS2, BIAS3 for selecting either the through connection or the one selected calibration standard based on a control signal provided to the switching control circuit 60 via the second port 43 (calibration control port) of the dedicated calibration circuit 32.

The dedicated calibration circuit 32 of FIG. 4 provides the generated bias voltages BIAS1, BIAS2, BIAS3 via inductivities 62, 63, 64 to the diodes 65, 66, 67. The inductivities 62, 63, 64 may block high frequency signals, in particular high frequency signal components of the measurement signal (RF signal).

The dedicated calibration circuit 32 includes the calibration standards permanently. The selectable calibration standards form a permanent part of the VNA frontend 3. The calibration standards form an integral part of the dedicated calibration circuit 32. Connecting a selected calibration standard of an external calibration kit to the signal path during a calibration process, for example using a screw connection to an externally accessible port, is only required at increased time intervals for calibrating the portion of the signal path of the measurement signal between the dedicated calibration circuit 32 of the frontend 3 and the DUT, in particular the DUT port.

Figure 5:
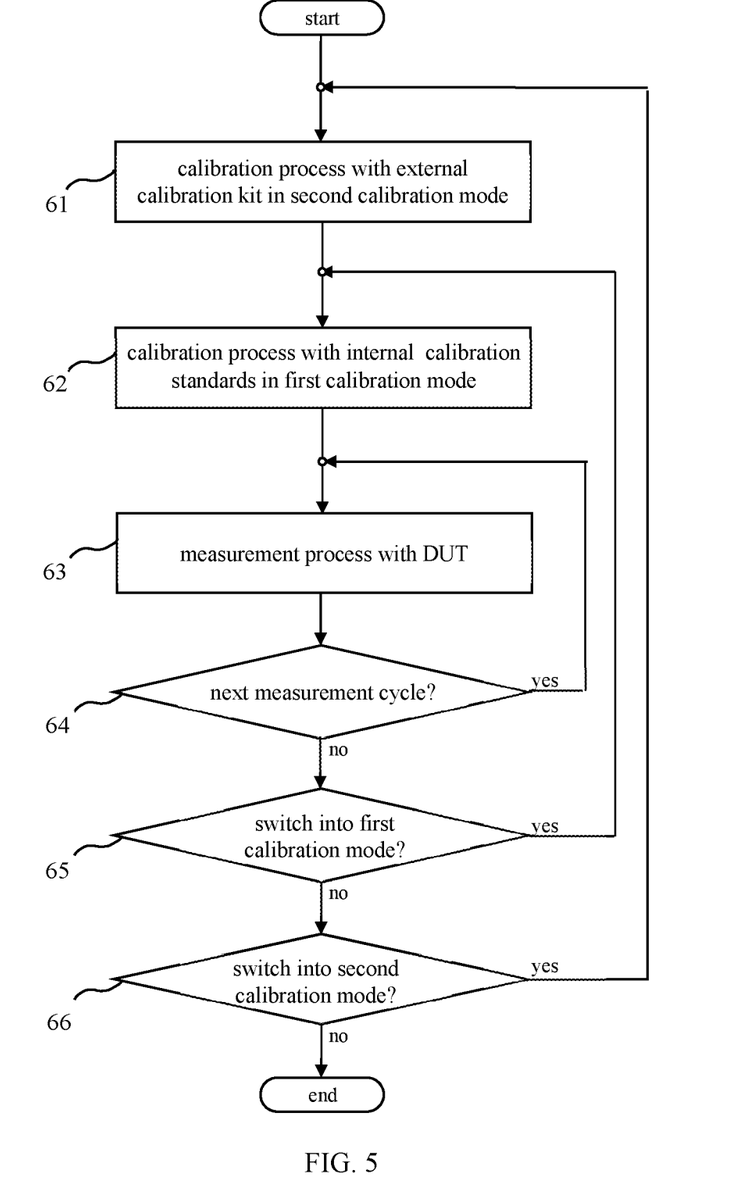
FIG. 5 shows a simplified flowchart of a measurement method including a calibration method according to an embodiment.

FIG. 5 shows a simplified flowchart of a measurement method implementing a calibration method of the embodiment.

The measurement method includes two calibration processes 61, 62 and a measurement process 63. The calibration processes include a calibration using an external calibration kit in the second calibration mode and the calibration method using the internal calibration standards in the first calibration mode.

The external calibration kit may comprise the calibration standards OPEN, SHORT, and MATCH for performing an OSM-calibration.

During the OSM-calibration using the external calibration kit in the calibration process 61, the dedicated calibration circuit 32 switches the trough connection between the directive element 31 and the measurement port 33. The reference plane for the OSM-calibration using the external calibration kit is at the measurement port 33.

During the calibration process 61, the calibration standards OPEN, SHORT, and MATCH are subsequently connected to the measurement port.

The VNA 2 measures the incident wave signal a and the reflected wave signal b for each of the calibration standards OPEN, SHORT, and MATCH of the external calibration kit.

The calibration process 61 may be performed interactively with the user connecting and disconnecting the external calibration standards at the measurement port 33. The HMI 9 may guide the user during the calibration process 61.

The VNA 2 acquires data of the external calibration kit.

The VNA 2 performs an OSM calibration based on the measured incident wave signals a and the measured reflected wave signals b for each of the calibration standards OPEN, SHORT, and MATCH of the external calibration kit, further based on the acquired data of the external calibration kit. The VNA 2 generates and records correction coefficients during the calibration process 61.

Subsequently, the measurement system 1 performs calibration in the first calibration mode in the calibration process 62. The control circuit 8 switches the dedicated calibration circuit of the VNA remote frontend 3 from the through connection successively to the internal calibration standards of the dedicated calibration circuit 3. The measurement system 1 now performs calibration according to the calibration process 61 in the first calibration mode.

The calibration process 61 in case of a plurality of remote VNA frontends 3 present in the measurement system 1, e.g.

of the first remote VNA frontend 3.1, the second remote VNA frontend 3.2, the third remote VNA frontend 3.3, and the fourth remote VNA frontend 3.4 according to FIG. 1, may be performed simultaneously.

In particular, the control circuit 8 may switch the dedicated calibration circuit 32 to apply the internal calibration standards OPEN, SHORT, and MATCH successively to the transmission line of the first port 41 of the dedicated calibration circuit 32. The VNA 2 respectively measures each of the internal calibration standards OPEN, SHORT, and MATCH of the dedicated calibration circuit 32. The VNA performs error correction using the OSM calibration performed previously for the external calibration standards OPEN, SHORT, and MATCH in the calibration process 61 to determine corrected internal calibration standards OPEN, SHORT, and MATCH with respect to the measurement port 33.

The VNA 2 records the determined corrected internal calibration standards OPEN, SHORT, and MATCH with respect to the measurement port 33 into a memory.

The memory may include an EEPROM for storing correction coefficients calculated during the calibration processes 61, 62 using the dedicated calibration circuit 32 and the external calibration kit.

For a subsequent measurement process 63, the control circuit switches the dedicated calibration circuit 32 of the remote VNA frontend 3 to the through connection.

During the subsequent measurement process 63, the VNA 2 uses the determined corrected correction coefficients based on the corrected internal calibration standards OPEN, SHORT, and MATCH to perform an OSM calibration of measurement signals acquired during the measurement process with respect to the measurement port 33.

The measurement system 1 may perform the measurement process 63 for the DUT 4 repeatedly, thereby performing a plurality of measurement cycles. The measurement method may determine in step 64 a number of measurement cycles.

The measurement method may determine in step 65, whether a predetermined criterion for a recalibration has been met. In case, the predetermined criterion for recalibration has been met in step 65 (*yes*), the measurement method returns to step 62 and performs the calibration process 62 in the first calibration mode.

The predetermined criterion may include at least one threshold for the number of measurement cycles since a last running the calibration process 62.

Alternatively or additionally, the predetermined criterion may include at least one threshold for an elapsed time since last running the calibration process 62.

Alternatively or additionally, the predetermined criterion may include at least one threshold for a change in at least one environmental condition, e.g. a temperature change since last running the calibration process 62.

The measurement method may determine in step 66, whether a further predetermined criterion for a recalibration has been met. In case, the predetermined criterion for recalibration has been met in step 66 (*yes*), the measurement method returns to step 61 and performs the calibration process 61 in the second calibration mode.

The further predetermined criterion may include at least one threshold for the number of measurement cycles since a last running the calibration process 61.

Alternatively or additionally, the predetermined criterion may include at least one threshold for an elapsed time since last running the calibration process 61.

Alternatively or additionally, the predetermined criterion may include at least one threshold for a change in at least one environmental condition, e.g. a temperature change since last running the calibration process 61.

By choosing the predetermined criterion and the further predetermined criterion accordingly, a first time interval between running the calibration process 62 may be adjusted to be smaller than a second time interval between running the calibration process 63. For example, the first time interval and the second time interval may differ by an order of magnitude.

Thus, the measurement method including the calibration processes 61, 62 and the measurement process 63 integrates a functionality of an inline calibration unit into the remote VNA frontend 3 of the measurement system 1.

Alternatively, a reference plane for the OSM-calibration using the external calibration kit is at a second end of a measurement cable connecting the measurement port 33 to the DUT 4 or to the calibration standards OPEN, SHORT, and MATCH of the external calibration kit in the calibration process 61. During a subsequent measurement process 63, the VNA 2 uses the determined correction coefficients of the corrected internal calibration standards OPEN, SHORT, and MATCH to perform an OSM calibration of measurement signals acquired during the measurement process 63 with respect to the second end of the measurement cable connecting the measurement port with the DUT.

The external calibration kit may additionally comprise a calibration standard UNKNOWN. The acquired data may then include data on the calibration standard UNKNOWN, and the VNA 2 may perform calibration using the calibration standard UNKNOWN in addition to the calibration standards OPEN, SHORT, and MATCH as discussed above.

The features described above or features shown in the figures can be combined with each other in any advantageous manner within the scope of the disclosure.

The invention claimed is:

1. A measurement system comprising a vector analyzer (VNA), at least one remote frontend, and a cable connection connecting the remote frontend to the VNA, the VNA comprises at least one signal source generating a radio frequency (RF) signal and providing the RF signal via the cable connection to the remote frontend;

the remote frontend includes at least one measurement port for connecting a device under test (DUT) and transmitting the RF signal to the DUT, and at least one directive element, the at least one directive element couples out a transmitted portion of the RF signal and a reflected portion of the RF signal received at the at least one measurement port for measuring the transmitted portion and the reflected portion of the RF signal; and the remote frontend further includes at least one dedicated calibration circuit connected between the at least one directive element and the at least one measurement port, and the at least one dedicated calibration circuit provides calibration standards for calibrating the measurement system, the measurement system further comprising a control circuit controlling the at least one dedicated calibration circuit in at least a first calibration mode, in which the control circuit consecutively selects a respective calibration standard from the calibration standards provided by the at least one dedicated calibration circuit, the control circuit switches the at least one dedicated calibration circuit into the first calibration mode to control the at least one dedicated calibration circuit in the first calibration mode after at least one of a predetermined time interval has elapsed and a predetermined number of measurement cycles is reached, the measurement system further comprising an output interface, and the control circuit generates and outputs a message via the output interface for prompting the control circuit to switch the at least one dedicated calibration circuit into a second calibration mode to control the at least one dedicated calibration circuit in the second calibration mode, wherein either:
- (1) in the second calibration mode, the control circuit controls the dedicated calibration circuit to establish a direct connection between the at least one directive element and the at least one measurement port, and in the second calibration mode, the control circuit controls measuring external calibration standards connected to the at least one measurement port, or
- (2) the control circuit switches the at least one dedicated calibration circuit into the first calibration mode more often than the control circuit switches the at least one dedicated calibration circuit into the second calibration mode.

2. The measurement system of claim 1,
wherein the at least one dedicated calibration circuit provides the calibration standards including an open load calibration standard (OPEN), a short load calibration standard (SHORT) and a matched load calibration standard (MATCH).

3. The measurement system of claim 1,
wherein the remote frontend arranges the at least one dedicated calibration circuit on a same substrate of the remote frontend on which a transmission line transmitting the RF signal to the at least one measurement port is arranged.

4. The measurement system of claim 1,
wherein, in the second calibration mode, the control circuit generates and outputs a message via the output interface for guiding a user to connect the external calibration standards to the at least one measurement port, and controls measuring the external calibration standards connected to the at least one measurement port.

5. The measurement system of claim 1,
the measurement system further comprises at least one measurement cable connected with a first end to the least one measurement port, and, in the second calibration mode, the control circuit generates and outputs a message via the output interface for guiding a user to connect the external calibration standards to a second end of the at least one measurement cable.

6. The measurement system of claim 1,
wherein, in the first and the second calibration mode, the control circuit measures a voltage reflection coefficient for each calibration standard of the calibration standards and the external calibration standards.

7. The measurement system of claim 1,
wherein the at least one dedicated calibration circuit comprises a plurality of semiconductor switches configured to switch between the respective calibration standards of the calibration standards and to directly connect the at least one directive element with the at least one measurement port.

8. The measurement system of claim 1,
wherein the measurement system comprises a second remote frontend, a third remote frontend and a fourth remote frontend, and wherein each of the second remote frontend, the third remote frontend and the fourth remote frontend respectively comprises at least one respective measurement port connecting the DUT and transmitting the RF signal to the DUT, and at least one respective directive element, the at least one respective directive element couples out a respective transmitted portion of the RF signal and a respective reflected portion of the RF signal received at the at least one respective measurement port for measuring the respective transmitted portion and the respective reflected portion of the RF signal; and each of the second remote frontend, the third remote frontend and the fourth remote frontend respectively further comprises at least one respective calibration circuit connected between the at least one respective directive element and the at least one respective measurement port, and the at least one respective dedicated calibration circuit provides respective calibration standards for calibrating the measurement system.

9. The measurement system of claim 8,
wherein the first remote frontend, the second remote frontend, the third remote frontend, and the fourth remote frontend each comprise a respective housing for arranging the first remote frontend, the second remote frontend, the third remote frontend, and the fourth remote frontend spaced apart from each other.

10. The measurement system of claim 8,
comprising further a control circuit controlling the respective dedicated calibration circuits of the first remote frontend, the second remote frontend, the third remote frontend, and the fourth remote frontend in at least a first calibration mode, wherein, in the first calibration mode, the control circuit consecutively selects a respective calibration standard from the calibration standards provided by the respective dedicated calibration circuit of the first remote frontend, the second remote frontend, the third remote frontend, and the fourth remote frontend, and the control circuit controls at least two of the respective dedicated calibration circuits of the first remote frontend, the second remote frontend, the third remote frontend, and the fourth remote frontend in the first calibration mode at a same time.

11. The measurement system of claim 8,
wherein the at least one signal source generates the RF signal and provides the RF signal via a respective first cable of the cable connection to each of the first remote frontend, the second remote frontend, the third remote frontend, and the fourth remote frontend, or the VNA comprises a plurality of signal sources including a first signal source and further a second signal source, a third signal source and a fourth signal source, and wherein each of the first signal source, the second signal source, the third signal source and the fourth signal source generates a respective RF signal and provides the respective RF signal via a respective first cable to the respective remote frontend of the first remote frontend, the second remote frontend, the third remote frontend, and the fourth remote frontend, independent from the respective other signal sources of the first signal source, the second signal source, the third signal source and the fourth signal source.

12. A calibration method for a measurement system,
the measurement system comprising a vector network analyzer (VNA), at least one remote frontend, and a cable connection connecting the remote frontend to the VNA,
wherein the remote frontend includes at least one dedicated calibration circuit connected between at least one directive element and the at least one measurement port, and the at least one dedicated calibration circuit provides calibration standards for calibrating the measurement system,
the calibration method comprising:
 connecting, to at least one measurement port of the remote frontend, a device under test (DUT);
 generating, by at least one signal source of the VNA, a radio frequency (RF) signal and providing the RF signal via the cable connection and via the directive element of the at least one remote frontend to the at least one measurement port;
 transmitting the RF signal to the DUT via the at least one measurement port;
 the at least one directive element coupling out a transmitted portion of the RF signal and a reflected portion of the RF signal received at the at least one measurement port for measuring the transmitted portion and the received portion of the RF signal; and
 controlling, by a control circuit of the measurement system, the dedicated calibration circuit in a calibration mode, in which the dedicated calibration circuit provides the calibration standards for calibrating the measurements system,
 controlling, by the control circuit, the at least one dedicated calibration circuit in at least a first calibration mode, in which the control circuit consecutively selects a respective calibration standard from the calibration standards provided by the at least one dedicated calibration circuit,
 the control circuit switches the at least one dedicated calibration circuit into the first calibration mode to control the at least one dedicated calibration circuit in the first calibration mode after at least one of a predetermined time interval has elapsed and a predetermined number of measurement cycles is reached,
 the control circuit generates and outputs a message via an output interface for prompting the control circuit to switch the at least one dedicated calibration circuit into a second calibration mode to control the at least one dedicated calibration circuit in the second calibration mode,
wherein either:
 (1) in the second calibration mode, the control circuit controls the dedicated calibration circuit to establish a direct connection between the at least one directive element and the at least one measurement port, and in the second calibration mode, the control circuit controls measuring external calibration standards connected to the at least one measurement port, or
 (2) the control circuit switches the at least one dedicated calibration circuit into the first calibration mode more often than the control circuit switches the at least one dedicated calibration circuit into the second calibration mode.

13. A measurement system comprising a vector analyzer (VNA), at least one remote frontend arranged within outside a climate cell, and a cable connection connecting the remote frontend to the VNA,
 the VNA comprises at least one signal source generating a radio frequency (RF) signal and providing the RF signal via the cable connection to the remote frontend;
 the remote frontend includes at least one measurement port for connecting a device under test (DUT) and transmitting the RF signal to the DUT, the DUT arranged in the climate cell to simulate exposure of the DUT to various environmental conditions, and at least one directive element,
 the at least one directive element couples out a transmitted portion of the RF signal and a reflected portion of the RF signal received at the at least one measurement port for measuring the transmitted portion and the reflected portion of the RF signal; and
 the remote frontend further includes at least one dedicated calibration circuit connected between the at least one directive element and the at least one measurement port, and
 the at least one dedicated calibration circuit provides calibration standards for calibrating the measurement system.

* * * * *